United States Patent [19]

Gehner et al.

[11] Patent Number: 5,495,280

[45] Date of Patent: Feb. 27, 1996

[54] ILLUMINATION DEVICE USING A PULSED LASER SOURCE A SCHLIEREN OPTICAL SYSTEM, AND A MATRIX ADDRESSABLE SURFACE LIGHT MODULATOR FOR PRODUCING IMAGES WITH UNDIFFRACTED LIGHT

[75] Inventors: Andreas Gehner; Günther Hess; Heinz Kück, all of Duisburg; Holger Vogt, Mülheim, all of Germany

[73] Assignee: Fraunhofer-Gesellschaft zur Förderung der Angewandten Forschung E.V., Munich, Germany

[21] Appl. No.: 211,973

[22] Filed: Jun. 17, 1994

[51] Int. Cl.⁶ ................................... G03B 27/54
[52] U.S. Cl. .................... 347/258; 347/241; 347/242
[58] Field of Search ......................... 346/108, 160, 346/107 R; 355/73; 353/98; 347/258, 241, 242

[56] References Cited

U.S. PATENT DOCUMENTS 3,580,126  5/1971  Forkner ......................... 353/98
3,930,684  1/1976  Lasch, Jr. et al. ................ 355/73
5,296,891  4/1994  Vogt et al. ...................... 347/258

Primary Examiner—Benjamin R. Fuller
Assistant Examiner—Raquel Yvette Gordon
Attorney, Agent, or Firm—Wolf, Greenfield & Sacks

[57] ABSTRACT

An illumination device used for the direct illumination of light-sensitive layers comprises a light source and a pattern generator.

The pattern generator includes an optical Schlieren system and an active, matrix-addressable surface light generator. The Schlieren system comprises a Schlieren lens and a projection lens as well as a mirror device, which is arranged between these lenses and which directs light coming from the light source onto the surface of the surface light modulator. A filter device is used for filtering out diffracted light and for permitting undiffracted light to pass from the surface light modulator to the projection lens. The structure to be illuminated is secured in position on a displaceable positioning table. The surface light modulator is addressed such that the non-addressed surface areas thereof correspond to the projection areas of said structure which are to be illuminated.

10 Claims, 6 Drawing Sheets

ILLUMINATION DEVICE USING A PULSED LASER SOURCE A SCHLIEREN OPTICAL SYSTEM, AND A MATRIX ADDRESSABLE SURFACE LIGHT MODULATOR FOR PRODUCING IMAGES WITH UNDIFFRACTED LIGHT

BACKGROUND OF THE INVENTION

The present invention refers to an illumination device or exposure device for producing models, such as reticles and masks, used for manufacturing electronic elements, or for direct illumination of wafers and substrates during the photolithographic steps required for production, or for direct illumination of structures including light-sensitive layers, said illumination or exposure device comprising a light source and a pattern generator.

The present invention especially deals with the production of models, reticles and masks, or with direct illumination in the micrometer range in the fields of semiconductor production, the production of integrated circuits, hybrid production and the production of flat screens as well as similar production methods in the case of which illumination processes are used. The present invention especially concerns an illumination device, which is adapted to be used for direct illumination of semiconductor wafers in the field of semiconductor production and for direct illumination of substrates in the field of hybrid and bonding technology.

For the production of reticles, which are illumination templates for the photolithographic production of circuits, as well as for the production of masks and for direct illumination of semiconductor products, electron beam writers, laser beam units and optical pattern generators including a laser light source or a mercury-vapour lamp are used. Optical pattern generators according to the prior art produce the desired structures by carrying out successive, individual illuminations of rectangular windows, which are defined by mechanical rectangular shields. The complexity of the structure to be produced determines the number of illumination rectangles required, and said number, in turn, determines the writing time or the exposure time for the structure. The accuracy of the structures which can be produced by these known pattern generators is, in turn, limited by the accuracy of the mechanical rectangular shields used.

In the case of laser beam units according to the prior art, the surface to be illuminated is rastered by a laser beam. The writing speed or illumination speed of such laser beam units is limited due to the serial data flow required for the rastering process. In addition, such laser beam units necessitate high mechanical-optical investments.

The electron beam units employed in the prior art can only be used for the illumination of electron-sensitive, special photoresist systems, and, in comparison with the above-described laser beam units, they additionally require the use of a high-vacuum technique. It follows that electron beam units necessitate very high capital expenditure and operating costs.

The technical publication B. W. Brinker et al, "Deformation behavior of thin viscoelastic layers used in an active, matrix-addressed spatial light modulator", Proceedings of SPIE 1989, vol. 1018, already discloses the use of a reflective optical Schlieren system including an active, matrix-addressed, viscoelastic surface light modulator for the purpose of producing television pictures or for the purpose of image display. This surface light modulator includes a permanent light source whose light falls vertically onto the surface of the surface light modulator through an appropriate optical system. Surface areas of the surface light modulator are adapted to be deformed in response to addressing of control electrodes so that the light falling onto the surface will be reflected as diffracted light in the case of addressed surface elements and as undiffracted light in the case of non-addressed surface elements. The undiffracted light will be returned to the light source, whereas the diffracted light will be used via the optical Schlieren system for image production on the television screen or on an image display area.

The company publication of the firm of Texas Instruments, JMF 008:0260; 10/87, discloses a surface light modulator whose reflective surface consists of a plurality of electrically addressable, mechanically deformable reeds.

The applicant's prior, not-prepublished international patent application now U.S. Pat. No. 5,296,891 discloses an illumination device for producing models used for manufacturing electronic elements, or for direct illumination of wafers or substrates, comprising a light source and a pattern generator, said pattern generator including an optical Schlieren system and an active, matrix-addressable light modulator, which has a reflective surface whose addressed surface areas diffract incident light and whose non-addressed surface areas reflect incident light, said Schlieren system comprising a Schlieren lens, which is arranged close to the surface light modulator, and a projection lens, a filter device being arranged between said Schlieren lens and said projection lens, said filter device filtering out the light of non-addressed surface areas and permitting only the diffracted light of addressed surface areas of the surface light modulator to pass via the projection lens to the model and the electronic element, respectively. This illumination device operates in the positive mode, where the addressed areas of the surface light modulator correspond to exposed areas in the projection on the model and the electronic element, respectively. In other words, the filter device of this illumination device permits all orders of diffraction to pass, with the exception of the zeroth order. The intensity distribution of the projection shows an undesired modulation whose amplitude and modulation period depend on the number and on the nature of the orders of diffraction contributing to the projection as well as on the relative influence of the individual orders, the intensity contribution of one order of diffraction being propotional to the respective Bessel function raised to the power of two. The period of the fine structure of the projection must therefore be reduced to such an extent that it will no longer be resolved by the imaging optics nor by the photoresist to be exposed. For this purpose, it will, for example, be possible to minimize the grating constant of the surface light modulator, to reduce the projection scale, or to increase the so-called diffraction efficiency, whereby the influence of higher orders of diffraction will be increased. In view of the fact that an increase in the deformation amplitude is necessary for increasing the diffraction efficiency, this will entail an increased grating constant so that the desired effect will partly be nullified again. Hence, only a limited degree of homogeneity of the illumination of the individual pixels of the projection can be achieved by means of this illumination device.

U.S. Pat. No. 4,675,702 discloses a surface illumination device, which can be used e.g. for illuminating photosensitive films and which can be constructed as a "photoplotter". This illumination device comprises a light source for generating an essentially parallel light bundle falling through a controllable light matrix valve, which can, for example, be formed by a liquid-crystal layer, whereby areas of the photosensitive film which are not to be exposed will be defined.

U.S. Pat. No. 4,728,185 deals with a Schlieren imaging system, which can be used with light modulators in an optical printer. The light valves themselves can consist of electronically addressable surface light valves. The light valve disclosed in this publication is a bar-type light valve, but not an area-like one. Furthermore, the known illumination device is arranged such that only the parts of the bar-type light modulator which are addressed will be imaged on a photosensitive layer.

SUMMARY OF THE INVENTION

In comparison with this prior art, it is the object of the present invention to provide an illumination device of the type mentioned at the beginning, which, in spite of its simple structure, permits not only a reduced exposure time in comparison with the exposure time or writing time of laser beam systems or electron beam systems but guarantees also a homogeneous illumination of the individual pixels of the projection.

This object is achieved by an illumination device for producing models used for manufacturing electronic elements, or for direct illumination of wafers or substrates during the photolithographic steps required for their production, or for direct illumination of structures including light-sensitive layers, comprising:

a light source;

a pattern generator;

said pattern generator including an optical Schlieren system and an active, matrix-addressable surface light modulator;

said surface light modulator including a reflective surface having addressed surface areas which diffract incident light and non-addressed surface areas which reflect incident light, wherein said surface light modulator is addressed such that said non-addressed surface areas thereof will correspond to the projection areas of the model, or on the wafer, or of the electronic element, or of the structure which are to be illuminated;

said Schlieren system comprising a Schlieren lens arranged on a side of said surface light modulator, a projection lens facing away from said surface light modulator, and a mirror device arranged between said lenses for directing light coming from said light source onto said reflective surface on said surface light modulator;

wherein said Schlieren lens being arranged from said surface light modulator at a short distance relative to the focal length of said lens;

a filter device arranged between said Schlieren lens and said projection lens, said filter device having a structural design to filter out the diffracted light reflected by said addressed surface areas of said surface light modulator and to permit undiffracted light reflected by said non-addressed surface areas, to pass via said projection lens to the model, or to the electronic element, or to the structure; and a displaceable positioning table for securing the model, or the electronic element, or the structure so that a sharp image of the non-addressed surface areas of the surface light modulator is formed on the model, or on the electronic element, or on the wafer, or on the structure.

According to the present invention, the illumination device for producing models used for manufacturing electronic elements, or for direct illumination of wafers or substrates during the photolithographic steps required for their production, or for direct illumination of structures including light-sensitive layers, comprises a light source and a pattern generator, said pattern generator including an optical Schlieren system and an active, matrix-addressable surface light modulator, said surface light modulator being provided with a reflective surface whose addressed surface areas diffract incident light and whose non-addressed surface areas reflect incident light, and said Schlieren system comprising a Schlieren lens arranged on the side of the surface light modulator, a projection lens facing away from the surface light modulator as well as a mirror device which is arranged between these lenses and which directs light coming from the light source onto the surface of the surface light modulator, said Schlieren lens being arranged at a distance from the surface light modulator which is short relative to the focal length of said lens, and a filter device being arranged between the Schlieren lens and the projection lens, said filter device being provided with a structural design of such a nature that it will filter out the diffracted light reflected by the addressed surface areas of the surface light modulator and that it will permit the undiffracted light, which is reflected by the non-addressed surface areas, to pass via the projection lens to the model, or to the electronic element, or to the structure, said illumination device being additionally provided with a displaceable positioning table on which the model, or the electronic element, or the structure can be secured in position in such a way that a sharp image of the non-addressed surface areas of the surface light modulator can be formed on the model, or on the electronic element, or on the structure, and said surface light modulator being addressed such that its non-addressed surface areas correspond to the projection areas of the model, or of the electronic element, or of the structure to be exposed. It follows that the filter device included in the illumination device according to the present invention is constructed such that it will only permit zeroth-order light to pass, the surface light modulator being addressed in such a way that the non-addressed surface areas thereof correspond to the projection areas to be illuminated. To cut a long story short, the illumination device according to the present invention operates in a negative mode. In contrast to the above-described illumination device, which operates in a positive mode and in which the projection shows a fine structure, the illumination of the pixels does not show any fine structure when the illumination device according to the present invention is used, but it shows an ideal homogeneity with an ideal-rectangular intensity distribution. In addition to the homogeneous illumination of the projected pixels, a high proportional part of the intensity of the light source will be imaged, irrespectively of the diffraction efficiency which can be achieved. Furthermore, undesired scattered light will efficiently be suppressed, since, within the illumination device according to the present invention, the area shut off by means of a shutter is much larger than the area in which the light is allowed to pass.

Furthermore, the illumination device according to the present invention also avoids stability problems for guaranteeing a certain minimum intensity for the projection, since the illumination is effected in the non-addressed condition of the respective surface area so that, when the surface light modulator used is a surface light modulator with a viscoelastic control layer on which the reflective surface is arranged, the elastomer will be in its relaxed condition.

Further developments of the present invention are disclosed in the subclaims.

According to an essential aspect of the present invention, the light source of the illumination device according to the invention is a pulsed laser light source whose pulse duration is shorter than the minimum dimension of the structure to be produced divided by the displacement rate of the positioning table. On the basis of this embodiment, the illumination device according to the present invention permits a stroboscopelike illumination of the model, or of the electronic element, or of the structure during an essentially continuous displacement of the positioning table, whereby very high writing speeds and exposure speeds are achieved.

In spite of the high illumination intensity of the individual laser light pulses, the present invention makes use of a surface light modulator of a type employed in the prior art only for cases of use in which the illumination intensity is very low, this being e.g. the case with television screens. However, in view of the fact that the laser light pulses of the illumination device according to the present invention are only pulses of short duration, the surface light modulator will still meet the thermal requirements. On the basis of the rapid programmability or addressability of the surface light modulator, said surface light modulator can be reprogrammed or readdressed during the displacement movement of the positioning table between two successive partial images of an overall structure to be produced. This will not only permit a short exposure pulse sequence in the case of direct illumination of semiconductor wafers with repetitive structures, but it will also permit the production of irregular structures on the basis of the rapid reprogrammability of the surface light modulator.

Further developments of the illumination device according to the present invention re disclosed n the subclaims.

BRIEF DESCRIPTION OF THE DRAWINGS

In the following, a preferred embodiment of the illumination device according to the present invention will be explained in detail with reference to the drawings enclosed, in which.

DESCRIPTION OF THE PREFERRED EMBODIMENTS

Figure 1:
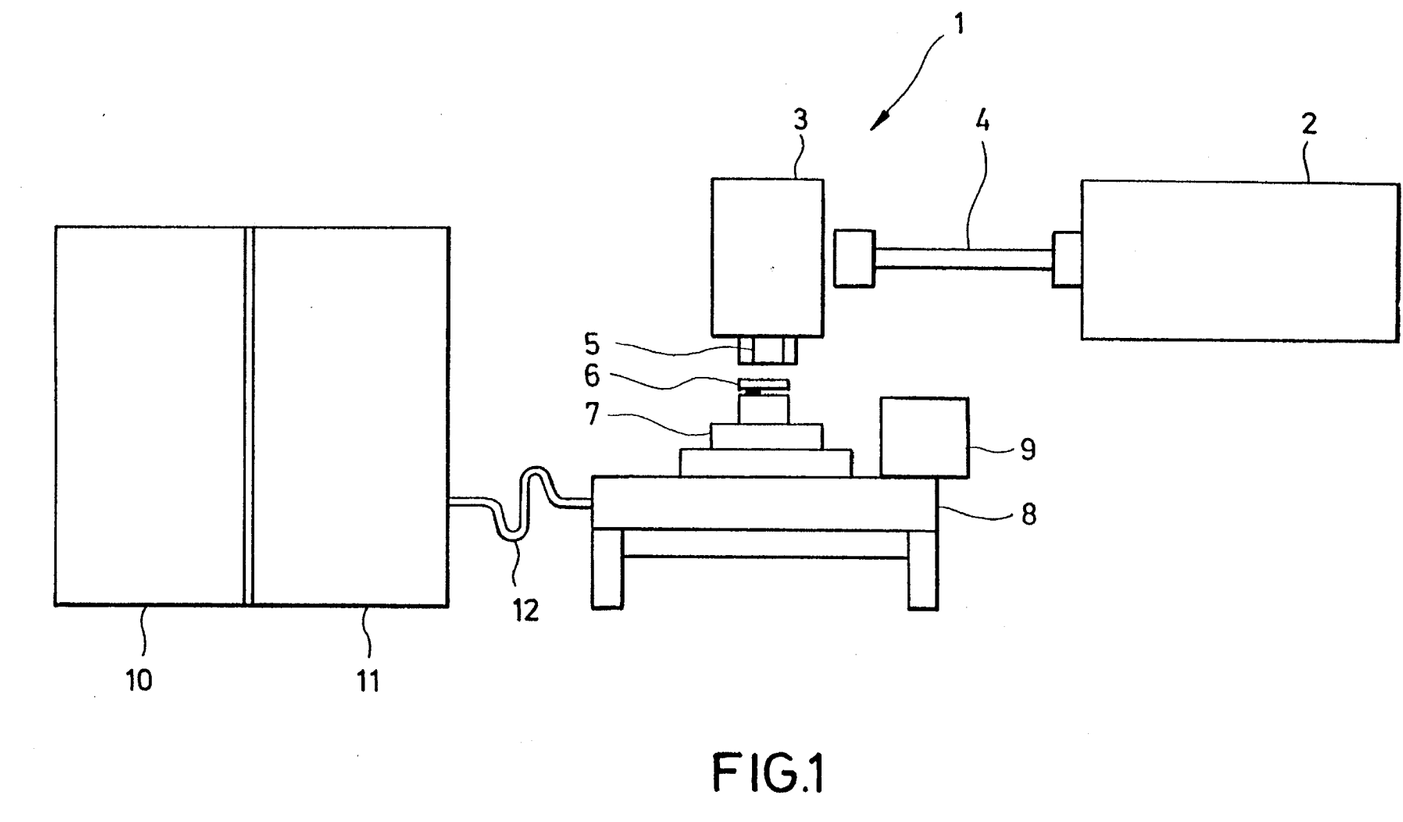
FIG. 1 shows a schematic representation of the total structure of the illumination device according to the present invention.

The illumination device shown in FIG. 1 is provided with reference numeral "1" in its entirety and serves to produce models, such as reticles and masks for the production of electronic elements, or to effect direct illumination of substrates or of structures with light-sensitive layers. The illumination device 1 according to the present invention includes an excimer laser light source 2. This excimer laser light source is a gas discharge laser device with wavelengths in the ultraviolet region of approx. 450 to 150 nm, which emits in a controllable manner light pulses with a very high light intensity per pulse and with a high repetition rate. The excimer laser light source 2 is connected to a pattern generator 3 via an illuminating optical unit 4. The illuminating optical unit 4 serves to supply the light coming from the excimer laser light source 2 to a surface light modulator 13, which forms part of the pattern generator 3 and which will be explained hereinbelow, in such a way that the light aperture of the excimer laser light source 2 will be adapted to the surface of the surface light modulator. In the case of preferred embodiments, which will be explained hereinbelow with respect to FIG. 2 and 3, the illuminating optical unit 4 is defined by lens systems whose structure is known per se.

By means of a projecting optical unit 5, the pattern generator forms an image of a pattern on a model 6 in a manner which will be described in detail hereinbelow, said model 6 being held by an x-y-$\Theta$ positioning table.

The projecting optical unit 5 does not only serve to form on the model 6 an image of the pattern produced by the pattern generator 3, but it also serves to carry out a desired magnification or demagnification upon forming the image and, as far as this is desired, to autofocus the image on the model 6.

As has already been explained, the model can, for example, be reticles or masks. In the case of direct illumination, which has been explained at the beginning as well, the x-y-$\Theta$ positioning table 7 carries, instead of the model 6, a semiconductor wafer to be illuminated, some other element which is to be produced by means of photolithography, or a structure with a light-sensitive layer which is to be written on or which is to be illuminated.

The positioning table 7 is arranged on a vibration-isolating support structure 8. This support structure 8 can have provided thereon a loading and unloading station 9 for additional models 6 or semiconductor elements, or for structures to be illuminated. The loading and unloading station 9 can be provided with a structural design which is normally used in the field of semiconductor production technology and which is suitable for automatically charging the positioning table 7 with the models or substrates to be illuminated or with other semiconductor elements.

A control computer 10 and the associated control electronics 11 carry out all control functions for the exposure device. The control computer 10 and the control electronics 11 especially communicate with the positioning table 7 for the purpose of computer-controlled position adjustment of the positioning table. The control computer 10 programmes and addresses, respectively, the pattern generator 3 in response to the respective control position of the positioning table 7 for successively producing partial images on the model 6 from which the exposed overall structure will result. A magnetic tape unit or an LAN interface (not shown) is used as a data carrier.

Figures 2A, 2B, 2C:
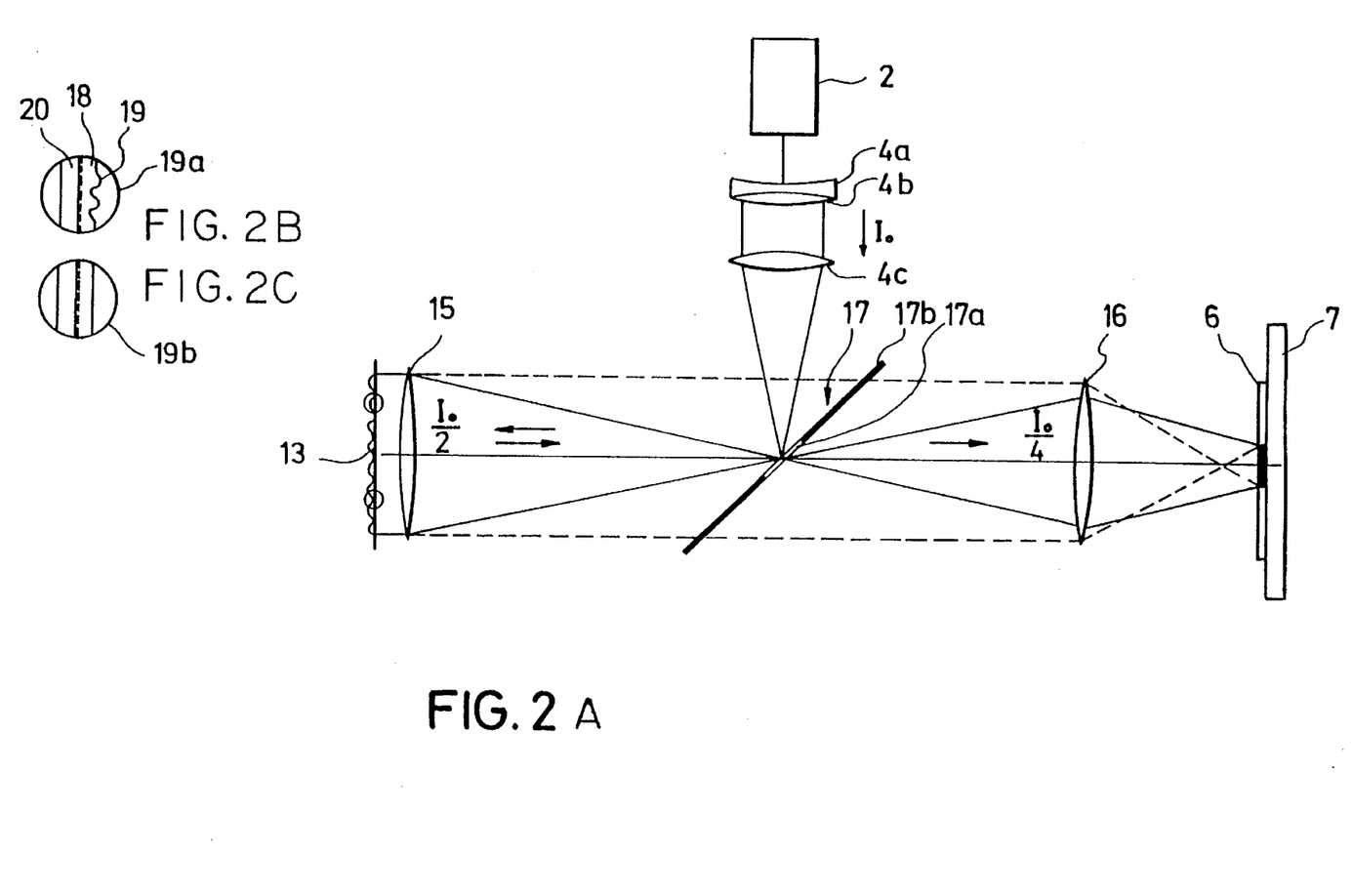
FIG. 2 to FIG. 4 show detailed representations of a first, second and third embodiment of the illumination device according to the present invention.

As can be seen in FIG. 2, the pattern generator 3 includes a surface light modulator or two-dimensional light modulator 13 as well as an optical Schlieren system comprising a Schlieren lens 15, which faces the surface light modulator 13, a projection lens 16, which faces away from the surface light modulator 13, and a mirror device 17, which is arranged between the Schlieren lens 15 and the projection lens 16.

Relative to its focal length, the Schlieren lens 15 is arranged at a short distance from the surface light modulator 13.

In the embodiment shown in FIG. 2, the mirror device comprises a semireflecting mirror 17a arranged at a distance from the Schlieren lens 15 which corresponds to the focal length of said Schlieren lens, said semireflecting mirror 17a being arranged such that it is rotated by 45° relative to the optical axis of the lenses 15, 16. Said semireflecting mirror 17a only extends along a comparatively small central area so that only the zeroth-order light reflected by the surface light modulator 13 will be allowed to pass by said mirror. Outside of this central area, the mirror device 17 is constructed as a shutter 17b, which serves to filter out all orders of diffraction of the light reflected by the surface light modulator, with the exception of the zeroth order. Since only half the intensity of the incident light coming from the light source 2 is deflected to the surface light modulator 13 by the semireflecting mirror 17a, and since, moreover, only half of the light reflected by said surface light modulator is allowed to pass to the projection lens 16, the intensity of the light arriving at the projection lens 16 will, at most, be one quarter of the intensity of the light emitted by the light source 2.

A beam expansion optical system 4a, 4b and a focussing optical system 4c, which serve to focus the light emitted by the excimer laser light source 2 onto the mirror device 17 and which are components of the illuminating optical unit 4, are positioned between the excimer laser light source 2 and the mirror device 17.

The surface light modulator 13 comprises a viscoelastic control layer 18, which is sealed by a reflective surface 19 towards the Schlieren lens 15, said reflective surface being formed e.g. by a metal film. Furthermore, the surface light modulator 13 includes an active addressing matrix 20, which can consist of a monolithic integrated array of MOS transistors with associated pairs of control electrodes. Typically, the addressing matrix 20 will comprise 2000× 2000 pixels. Each pixel or surface area 19a, 19b, . . . of the reflective surface 19 of the addressing matrix 20 has associated therewith two transistors with one or several pairs of electrodes forming each a diffraction grating with one or several grating periods with the vicoelastic layer 18 and its reflective surface 19.

When a surface area 19a, 19b, . . . is addressed by applying opposed voltages to the two electrodes of a pair of electrodes of the respective surface area (logical "1"), the reflective surface 19 will assume a form having an approximately sinusoidal cross-section. If not addressed, the respective surface area 19a, 19b, . . . will be flat. When a light beam falls on a non-addressed surface area 19a, 19 b, . . . , it will be reflected, whereupon it will pass on to the projection lens 16 through the semireflecting mirror 17a. Light beams of addressed surface areas are filtered out by the shutter 17b.

In the case of the embodiment according to FIG. 2, the mirror device 17 comprises the semireflecting mirror 17a as well as a shutter 17b, which serves as a filter device for the higher orders of diffraction. It follows that the semireflecting mirror 17a as well as the shutter 17b are essentially arranged in the focal plane of the Schlieren lens 15.

Figure 3:
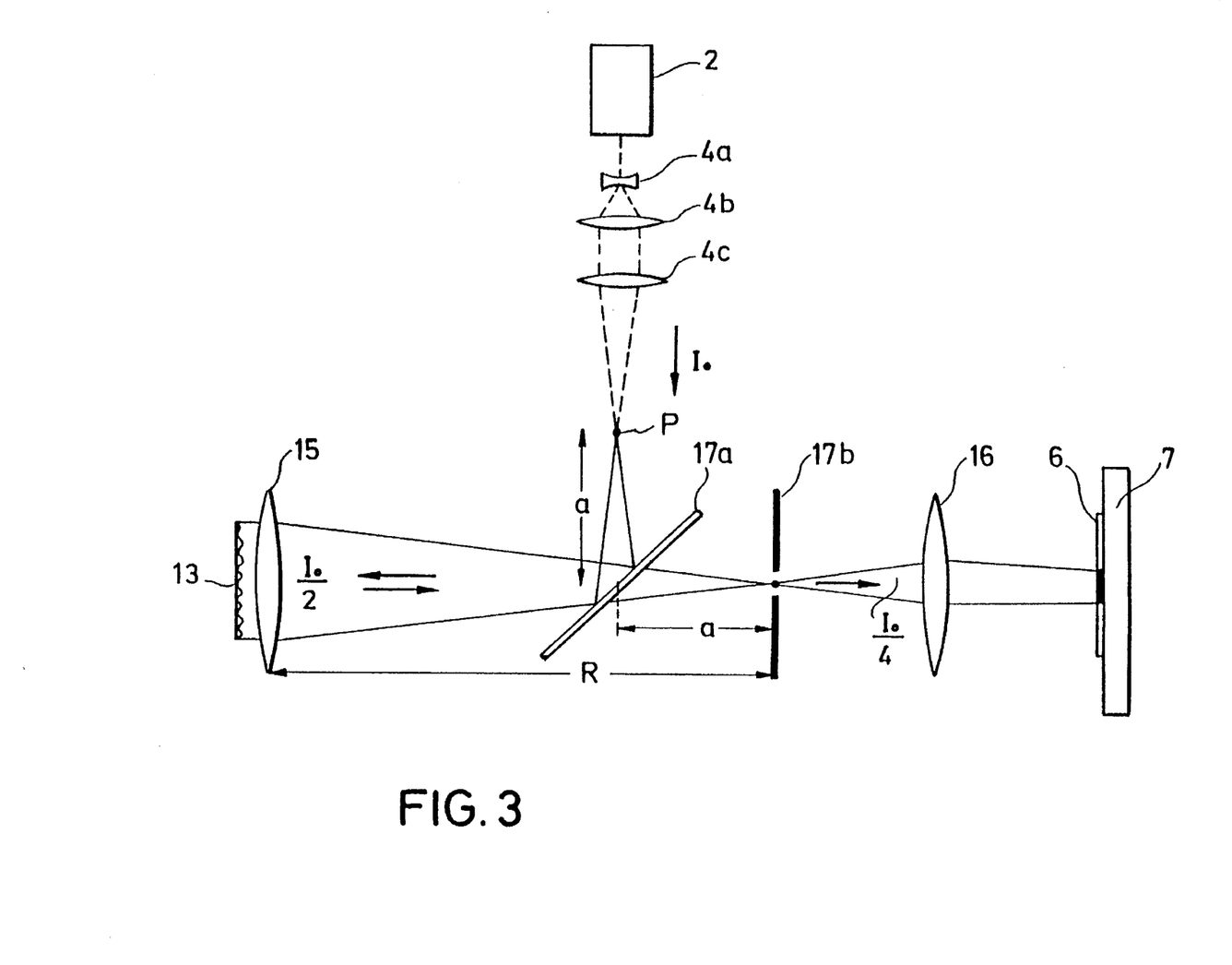

In the embodiment according to FIG. 2, the function of light introduction and the function of filtering are realized by the mirror device 17 comprising a semireflecting central mirror area and a shutterlike outer area. Deviating from this embodiment, it is possible to carry out a local and functional separation of the light-introduction and filtering functions, as will be explained hereinbelow with reference to FIG. 3. The embodiment according to FIG. 3 differs from the embodiment according to FIG. 2 with regard to the fact that the semireflecting mirror 17a according to said FIG. 3 is arranged such that, relative to the focal plane R of the Schlieren lens 15, it is displaced towards said Schlieren lens 15 along the optical axis. In this embodiment, the focussing means 4 will focus the light coming from the light source 2 in a point P whose distance a from the semireflecting mirror 17a in the axis of the beam path corresponds to the distance of the semireflecting mirror 17a in the optical axis of the optical system 15, 16 from the focal plane R of the Schlieren lens 15. The shutter 17b, which is now constructed as a functionally and locally separate member, is arranged in the focal plane and serves to permit the passage of zeroth-order light as well as to filter out light of higher orders of diffraction.

In cases in which the light coming from the light source 2 is focussed onto the semireflecting mirror 17a in the optical axis, it is also imaginable to arrange the semireflecting mirror 17a such that, relative to the focal plane of the Schlieren lens 15, it is displaced towards said Schlieren lens along the optical axis, whereby the diffraction plane will correspondingly move away from the focal plane of the Schlieren lens 15 in the opposite direction so that, in this case, the shutter 17b will have to be arranged such that, relative to the focal plane of the Schlieren lens 15, it is displaced in the direction of the projection lens 16.

The advantages of the last-described arrangements are to be seen in the fact that, in this case, the semireflecting mirror 17a and the filter device can be adjusted separately and optimized independently of each other with regard to their adjustment. In particular, different filters can be inserted in the illumination device without any effect being produced upon the adjustment of light introduction.

Figure 4:
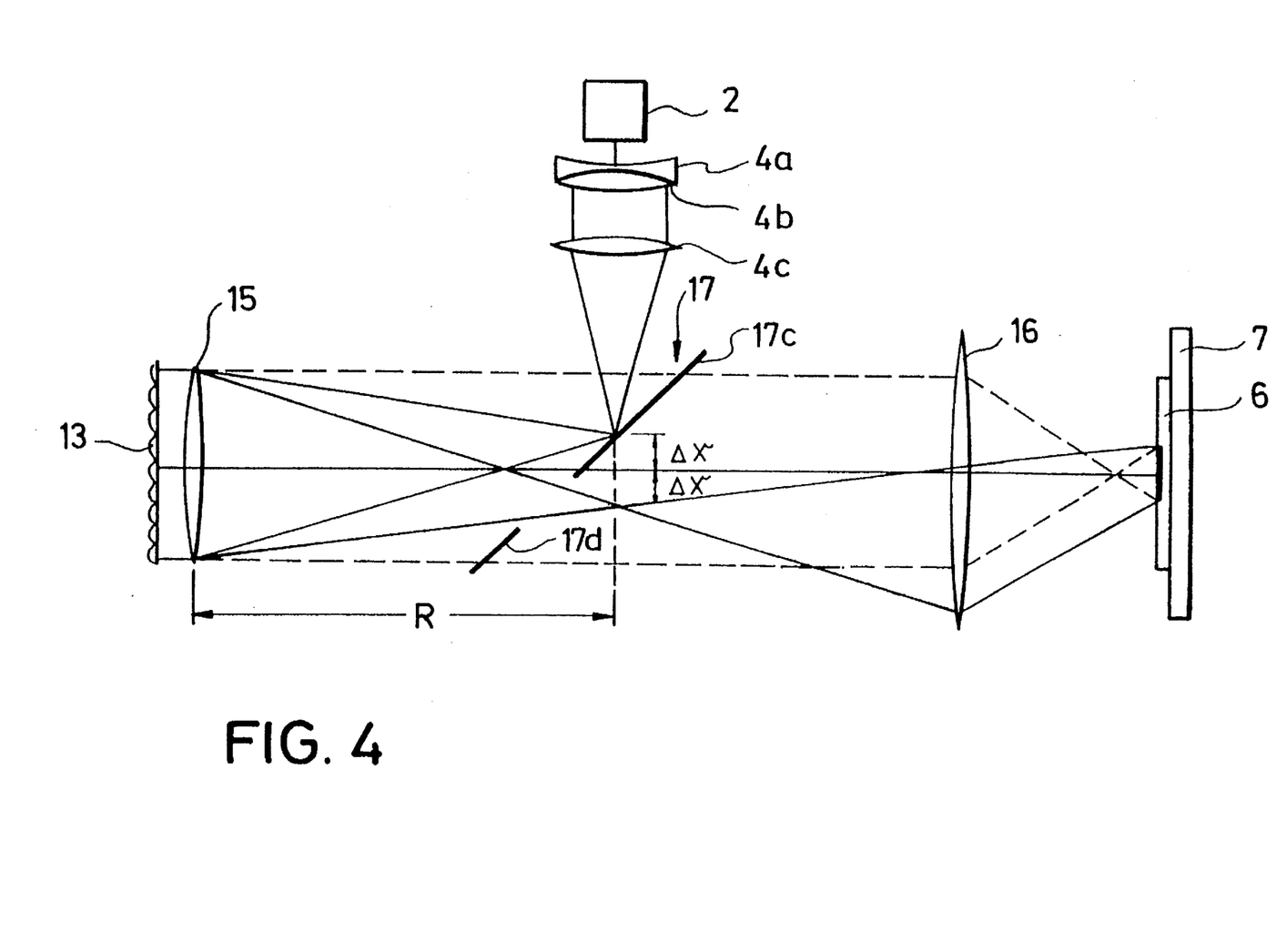

The embodiment according to FIG. 4 differs from the embodiment according to FIG. 2 with regard to the fact that the mirror device 17 is in this case formed by a mirrored slit-type shutter, which, with respect to the optical axis determined by the lenses 15, 16, is arranged at right angles to said optical axis in the incidence direction or opposite to the incidence direction of the light originating from the laser light source 2 with a displacement $\Delta x$. The slit 17d of the slit-type shutter 17c is arranged outside of the optical axis in such a way that the light reflected by the non-addressed surface areas 19a, 19b, . . . of the surface light modulator 13 will pass through said slit 17d in the direction of the projection lens 16. By means of the mirror defined by the slit-type shutter 17c, which is displaced upwards with respect to the optical axis in the drawing of FIG. 4, a separation of the point light source, which is formed on the slit-type shutter, and of the reflected zeroth-order light will be obtained.

In addition to the measure of raising the mirror device 17, an adaptation of the introduction angle will be required, when this embodiment is used; this adaptation can be carried out by means of the measures explained with reference to FIG. 5 and 6.

Figure 5:
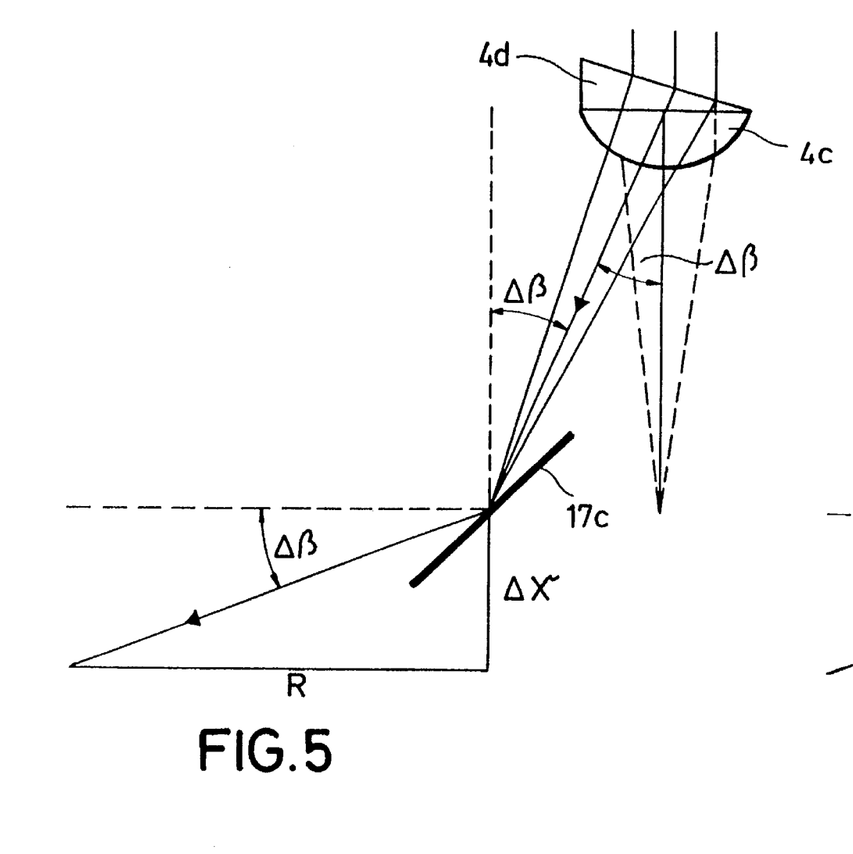
FIG. 5 shows a prism for adapting light introduction in the case of the embodiment according to FIG. 4.

As can be seen in FIG. 5, a prism 4d can be provided in front of the focussing optical system 4c, said prism 4d deflecting the parallel light, which falls on said prism, by an angle $\Delta\beta$ for which the following relationship holds true:

$$\Delta\beta = \text{arctg}\,(\Delta x/R),$$

wherein $\Delta x$ stands for the displacement and R for the focal length of the Schlieren lens 15.

Figure 6:
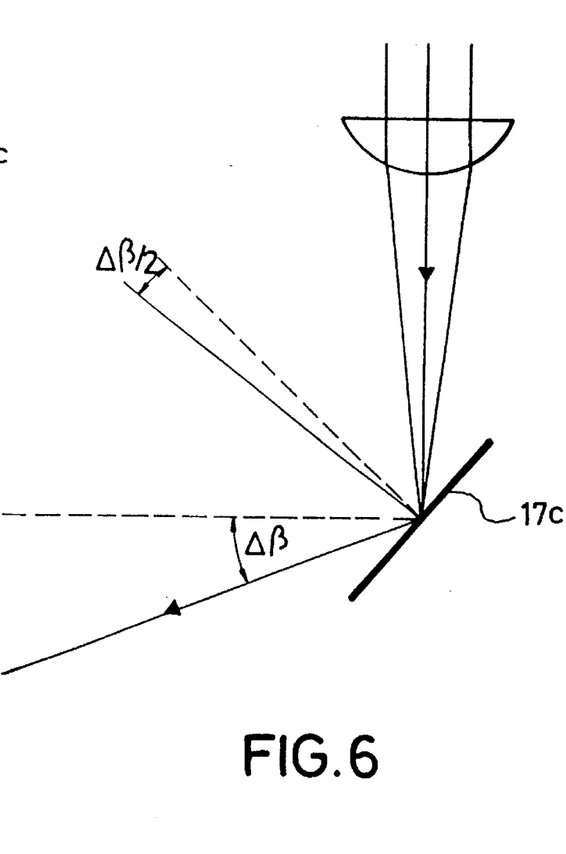
FIG. 6 shows an adaptation of the light introduction angle in the case of the embodiment according to FIG. 4 by a rotated mirror arrangement.

Deviating from the above, it is possible, as can be seen in FIG. 6, to carry out an adaptation of the introduction angle by rotating the mirror 17c by an angle $\Delta\beta/2$ for which the following relationship holds true:

$$\Delta\beta/2 = \tfrac{1}{2}\,\text{arctg}\,(\Delta x/R),$$

wherein Δx again stands for the displacement and R for the focal length of the Schlieren lens 15.

In contrast to the preceding embodiments, not only a single point light source, by means of which the surface light modulator 13 is illuminated, is generated in the embodiment which will be described hereinbelow with reference to FIG. 7, but a plurality of essentially point-symmetric point light sources are generated, which each illuminate the whole surface of the surface light modulator. In this embodiment, the mirror device 17 comprises three point-symmetrically arranged semireflecting mirrors 17α, 17β, 17γ, which are jointly arranged on a shutter structure 17δ used for filtering out reflected light of the first order of diffraction or of higher orders of diffraction.

The central mirror 17α is positioned at the focus of the Schlieren lens 15. The other semireflecting mirrors 17β, 17γ, are arranged symmetrically with respect to the first-mentioned mirror 17. The point light source, which is generated at the location of the second semireflecting mirror 17β, results in the case of non-addressed surface areas 19a, 19b in a reflected light beam passing through the third semireflecting mirror 17γ in the direction of the projection lens 16.

Figure 7:
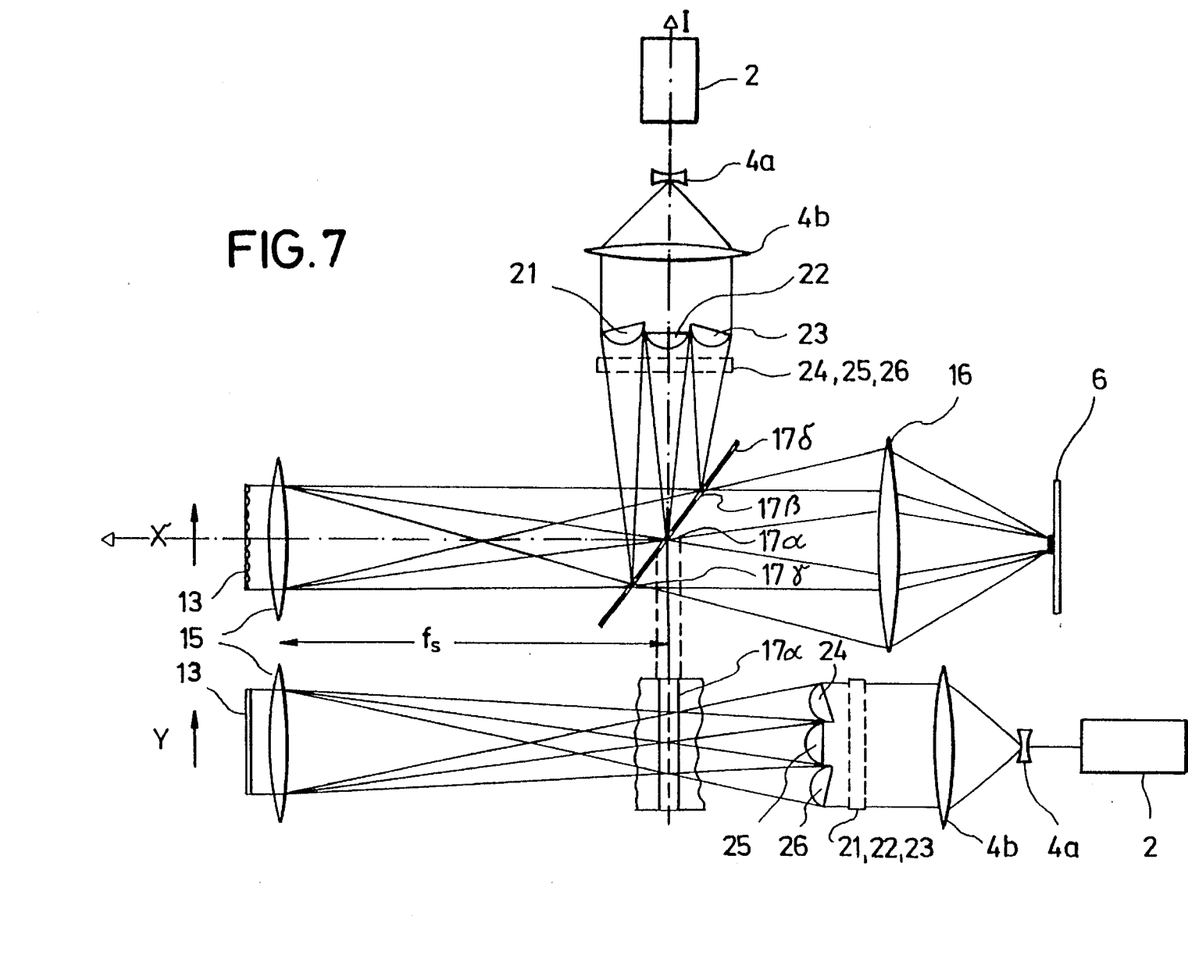
FIG. 7 shows a fourth embodiment of the illumination device according to the present invention.

The upper representation of FIG. 7 shows the illumination device in the x-z plane, whereas the lower representation shows the illumination device in the y-z plane along the sectional line I—I of the upper representation.

The respective directions of the axes of the semireflecting mirrors 17α, 17β, 17γ, extend in the y-direction and, consequently, parallel to the phase structure produced by the waviness of the surface 19 of the surface light modulator 13.

In order to produce the point light sources, the illuminating optical unit 4 comprises a cylindrical lens system 21, 22, 23 for each semireflecting mirror 17α, 17β, 17γ, said cylindrical lens system being oriented parallel to the phase structure, i.e. in the y direction.

As can be seen from FIG. 7, these cylindrical lens systems have different focal lengths for focussing onto the semireflecting mirrors 17α, 17β, 17γ. Furthermore, the cylindrical lens systems 21, 23 arranged outside of the optical axis include prisms, which will cause the light to fall on the respective mirrors 17β, 17γ, at such an angle that the surface light modulator 13 will in each case be illuminated throughout its whole surface. In the optical path behind the cylindrical lens system 21, 22, 23 arranged parallel to the phase structure, a cylindrical lens system 24, 25, 26 is provided, which is disposed perpendicularly to the phase structure and the structural design and arrangement of which corresponds to that of the cylindrical lens system just described. In the embodiment shown, the cylindrical lens systems, which are placed one behind the other, produce nine point light sources on the three semireflecting mirrors 17α, 17β, 17γ.

During operation, the positioning table 7 is continuously moved in a predetermined direction of movement, and in the course of this movement an image of overlapping partial images of the whole structure to be imaged will be formed on the model 6 by pulsing the excimer laser light source 2. The addressing matrix 20 will normally comprise a plurality of pixels which are not capable of functioning and which are the result of fabrication defects so that these pixels cannot, or not completely be switched to the logic states "1" and "0", respectively. These defects of the matrix 20 are compensated by locating all defective pixels and by treating them such that they will no longer reflect any light. The fact that each structure on the model 6 is produced by overlapping partial images guarantees that each part of the structure to be illuminated will be illuminated at least once by a pixel in working order or by a surface area in working order.

The production of the whole illuminated structure during continuous displacement of the positioning table 7 will not result in unsharpness, since the pulse duration of the pulsed excimer laser light source 2 is shorter than the minimum dimension of the structure to be produced divided by the displacement rate of the positioning table 7.

The data structure for controlling the addressing matrix 20 corresponds essentially to the data structure for controlling raster-orientated laser beam or electron beam units according to the prior art. An essential advantage resulting from the use of the illumination device according to the present invention is to be seen in the fact that the time required for transmitting large volumes of data can be reduced to an almost arbitrary extent on the basis of the subdivision of the addressing matrix 20 and on the basis of parallel programming of submatrixes of e.g. 16 or 32 strips. An additional advantage of the illumination device 1 according to the present invention, which includes the addressing matrix 20, is to be seen in the fact that, for the purpose of illuminating repetitive structures, such as regular arrays of integrated circuits on a silicon wafer, the addressing matrix 20 will have to be programmed only once and the programmed image will have to be stored only once for all identical structures.

It is possible to provide the illumination device 1 according to the present invention with an autocalibration system and with a system for fine adjustment of the models 6 in the case of direct writing. For this purpose, reference marks are provided on the positioning table 7 and on the model 6, and the addressing matrix 20 is used as a programmable reference mark. By means of autocalibration, magnification errors of the projecting optical unit 5 as well as all positioning errors can be compensated.

We claim:

1. An illumination device for producing models used for manufacturing electronic elements, or for direct illumination of wafers or substrates during photolithographic steps for producing the electronic elements, or for direct illumination of structures including light-sensitive layers, comprising:

a pulsed laser light source;

a pattern generator; an object onto which light emitted by said pulsed laser light source is focussed, said object being selected from the group consisting of a model, a disk, a substrate and a structure;

said pattern generator including an optical Schlieren system and an active, matrix-addressable surface light modulator;

said surface light modulator including a reflective surface having addressed surface areas which diffract incident light and non-addressed surface areas which reflect incident light, wherein said surface light modulator is addressed such that said non-addressed surface areas thereof correspond to projection areas of the model, the wafer, the substrate, or the structure; said Schlieren system comprising a Schlieren lens arranged on a side of said surface light modulator, a projection lens facing away from said surface light modulator, and a mirror device arranged between said Schlieren lens and said projection lens for directing light coming from said pulsed laser light source onto said reflective surface on said surface light modulator;

wherein said Schlieren lens is disposed from said surface light modulator at a distance less than a focal length of said Schlieren lens;

a filter device arranged between said Schlieren lens and said projection lens, said filter device being provided to filter light diffracted by said addressed surface areas of said surface light modulator and to permit undiffracted light reflected by said non-addressed surface areas to pass through said projection lens to the model, the substrate, or the structure;

a displaceable positioning table for securing the model, or the substrate, or the structure thereon so that a sharp image of the non-addressed surface areas of the surface light modulator is formed on the model, the substrate, the wafer, or the structure;

a device for controlling said pulsed laser light source such that a pulse duration of said pulsed laser light source is less that a minimum structural dimension of the model, the wafer, the substrate or the structure divided by a rate of displacement of said positioning table; and wherein, during displacement of said positioning table, the model, the wafer, the substrate or the structure are composed of a plurality of overlapping partial images by adequate addressing of said surface light modulator.

2. An illumination device according to claim 1, further comprising:

focussing means for focussing light coming from said pulsed laser light source onto said mirror device.

3. An illumination device according to claim 1, further comprising:

focussing means for focussing light coming from said pulsed laser light source onto a point in a beam path in front of said mirror device, the point being located a distance from said mirror device equal to a distance of a focal plane of said Schlieren lens from said mirror device.

4. An illumination device according to claim 1, wherein said mirror device comprises a semireflecting mirror arranged at a distance from said Schlieren lens which corresponds to a focal length of said Schlieren lens, areas of said semireflecting mirror which lie outside of a central area comprising a shutter to filter light diffracted by said addressed surface area, and wherein said semireflecting mirror is positioned on an optical axis determined by said Schlieren lens and said projection lens, said semireflecting mirror extending at an angle of 45° relative to said optical axis.

5. An illumination device according to claim 1, wherein said mirror device and said filter device include a mirrored slit-type shutter arranged at right angles to an optical axis determined by said Schlieren lens and said projection lens in an incidence direction or opposite to the incidence direction of light originating from the pulsed laser source, with a displacement $\Delta x$, and wherein a slit of said slit-type shutter is arranged outside of the optical axis so that light reflected by said non-addressed surface areas of said surface light modulator passes through said slit.

6. An illumination device according to claim 5, wherein said slit-type shutter is rotated relative to the 45° angle to the optical axis by an angle of rotation for which $$\Delta\beta/2 = \frac{1}{2} \operatorname{arctg}(\Delta x/R),$$

wherein $\Delta\beta$ stands for the angle of rotation, $\Delta x$ stands for the displacement and R stands for the focal length of said Schlieren lens.

7. An illumination device according to claim 5, wherein said slit-type shutter is arranged such that said slit-type shutter extends at an angle of 45° relative to the optical axis, and wherein light coming from said light source is deflected in a beam path in front of said slit-type shutter by a prism through an angle $\Delta\beta$ for which $$\Delta\beta = \operatorname{arctg}(\Delta x/R),$$

wherein $\Delta x$ stands for the displacement and R stands for the focal length of said Schlieren lens.

8. An illumination device according to claim 1, wherein said pulsed laser light source is an excimer laser light source.

9. An illumination device according to claim 1, wherein non-working surface areas of said surface light modulator are non-reflective, and wherein a device is included for controlling said surface area light modulator and said positioning table such that an imaged pixel of the model, the element, or the structure is illuminated at least twice with partially overlapping images so that a displacement of the imaged pixel corresponds to a distance by which said positioning table has been displaced between pulses for producing the images.

10. An illumination device according to claim 1, wherein a surface area of said surface light modulator has associated therewith two transistors, each transistor being provided with at least one pair of control electrodes and being capable of producing at least one diffraction grating with said reflective surface and a viscoelastic control layer covered by said reflective surface.

* * * * *